United States Patent
Wenke

(10) Patent No.: US 7,415,927 B2
(45) Date of Patent: Aug. 26, 2008

(54) PROCEDURE FOR POSITIONING A THROUGH-HOLE IN A SUBSTRATE

(75) Inventor: Stephan Wenke, Neustadt (DE)

(73) Assignee: LPKF Laser & Electronics AG, Garbsen (DE)

( * ) Notice: Subject to any disclaimer, the term of this patent is extended or adjusted under 35 U.S.C. 154(b) by 350 days.

(21) Appl. No.: 11/188,431

(22) Filed: Jul. 25, 2005

(65) Prior Publication Data

US 2006/0021528 A1 Feb. 2, 2006

(30) Foreign Application Priority Data

Jul. 28, 2004 (DE) .................. 10 2004 036 662

(51) Int. Cl.
*B41C 1/14* (2006.01)
(52) U.S. Cl. .............. 101/128.4; 430/308; 430/945
(58) Field of Classification Search ............. 101/114, 101/127, 127.1, 128.4, 129; 430/5, 308, 430/945
See application file for complete search history.

(56) References Cited

U.S. PATENT DOCUMENTS

| | | | |
|---|---|---|---|
| 5,444,212 A | 8/1995 | MacNaughton et al. | 219/121.7 |
| 5,580,698 A * | 12/1996 | Andersen | 430/308 |
| 5,588,359 A * | 12/1996 | Hofmann et al. | 101/128.21 |
| 5,822,209 A | 10/1998 | Fischer | 364/474.02 |
| 5,875,712 A * | 3/1999 | Ericsson et al. | 101/129 |
| 6,165,658 A * | 12/2000 | Taff et al. | 430/30 |
| 6,286,423 B1 * | 9/2001 | McCue et al. | 101/128.4 |
| 6,766,736 B2 * | 7/2004 | Regner et al. | 101/127 |
| 6,890,689 B2 | 5/2005 | Schaetz | 430/5 |
| 6,906,282 B2 * | 6/2005 | Hamada | 219/121.73 |
| 7,003,871 B2 * | 2/2006 | Ray | 29/825 |
| 2003/0041753 A1 | 3/2003 | Regner et al. | 101/129 |
| 2003/0137568 A1 * | 7/2003 | Shinada et al. | 347/86 |

FOREIGN PATENT DOCUMENTS

| | | |
|---|---|---|
| DE | 100 34 648 | 1/2002 |
| DE | 101 41 497 | 3/2003 |
| GB | 2 276 589 | 10/1994 |
| JP | 04 099626 | 3/1992 |

OTHER PUBLICATIONS

European Search Report for EP 05 01 5017, dated Oct. 25, 2005.

* cited by examiner

*Primary Examiner*—Ren Yan
(74) *Attorney, Agent, or Firm*—Darby & Darby

(57) ABSTRACT

A method for forming openings of predetermined position in a substrate in the form of a printing stencil by means of a laser, wherein the substrate is positioned using a fixture means in the form of a tensioning frame. In the process, a shift in position of openings resulting from subsequent processing steps and leading to a changed state of stress of the substrate is prevented by first determining the coordinates of a central reference point. Then, the respective distances of the predetermined positions of the openings from this reference point are determined, and an order of priority is determined therefrom. This order of priority then forms the basis for a machining program, which controls the path of movement of the laser head and forms the openings in the substrate.

12 Claims, 1 Drawing Sheet

PROCEDURE FOR POSITIONING A THROUGH-HOLE IN A SUBSTRATE

Priority is claimed to German Patent Application No. DE 10 2004 036 662.4, filed on Jul. 28, 2005, the entire disclosure of which is incorporated by reference herein.

The present invention relates to a method for forming openings having predetermined positions in a substrate, in particular to manufacture stencils or masks using a laser; the substrate being positioned during processing using a fixture means, especially in the form of a tensioning frame.

BACKGROUND

A substrate produced according to this method is already frequently used in practice as a printing stencil, such as in the manufacture of electronic modules containing SMT components. Prior to the placement of these components, solder paste is forced through the substrate openings onto connection pads of a printed circuit board, using the screen-printing technique.

Dimensionally stable printing stencils, which today are mostly made of steel or nickel, or, less frequently, of polyimide, are a prerequisite for carrying out the screen-printing technique. In screen-printing, the material thickness of the substrate forming the printing stencil determines the height of the printed solder paste.

In addition to the classical SMT production, screen-printing techniques using printing stencils are used, inter alia, also in the manufacture of wafers, high pin-count chip packages, ceramic multilayers, flip-chips, and OLED's (organic light emitting diodes).

Another important field of application for such stencils or masks is the use in sputtering and vapor deposition methods.

For an optimum printing result, high demands are placed on the printing stencil in terms of accuracy and reproducibility of the position and dimensions of the openings to be formed, and with regard to a uniform stress distribution across the entire surface of the printing stencil.

The weakening of the material, which is associated with the formation of the openings in the substrate and leads to an altogether changed state of stress of the substrate fixed in position by the tensioning frame, turns out to be a problem in practice. This change in the state of stress causes an unwanted deviation in position, in particular a shift of the already formed openings relative to the tensioning frame and also relative to openings which are to be formed subsequently.

Therefore, it is common practice to initially form all desired openings at the predetermined positions in a first operation, but first with reduced dimensions. In a second operation, the openings are then enlarged to their respective desired dimensions. In this manner, the shifts occurring after the first operation can be compensated for in the second operation. In this connection, the additional time required for the second operation turns out to be a disadvantage.

One idea that has been thought of so far is to predict the changing state of stress using a model in a computer and to derive correction values therefrom, said correction values entering into the determination of the positions when forming the openings. However, this idea has turned out to be very complicated and not very promising from an economic point of view.

Furthermore, DE 100 34 648 B4 describes a method for manufacturing a printing stencil, where a metal stencil is directly and non-releasably secured to a biased frame and subsequently tensioned by removing the bias from the frame. The openings forming the print pattern can be formed in the metal stencil by punching or boring, either before or after the metal stencil is mounted on the frame. The printing stencil can be used for PCB assembly, module production, or wafer bumping.

In a method for fabricating mask configurations according to DE 101 41 497 A1, it is proposed that systematic deviations in a configuration of recesses to be produced in a mask from a desired configuration be largely prevented by carrying out the patterning of the mask substrate in a sequence of subprocesses, said subprocesses being matched such that the deviations resulting from these subprocesses cancel each other out, thus providing for error correction.

Further, U.S. 2003/0041753 A1 describes a stencil or mask, which is provided with openings.

SUMMARY OF THE INVENTION

An object of the present invention is to improve a method of the type mentioned at the outset in such a way that a shift in position of the already formed openings resulting from subsequent processing steps can be prevented in a simple way.

Thus, the present invention provides a method in which, first, coordinates of a reference point in a central region spaced apart from the fixture means are determined; then, the distances of the respective predetermined positions of the openings from this reference point are calculated; and finally, an order of priority of the distances of the openings from the reference point is determined therefrom, said order of priority being provided to a machining program as the basis for the sequence for forming the openings. Thus, by determining the machining sequence according to the distances, the state of stress of the substrate can be compensated for or maintained constant for the first time and in a surprisingly simple way, thereby virtually preventing the already formed openings from being shifted in position due to subsequently formed openings. In this connection, the reference point is, in principle, freely selectable in a central region and may coincide with the geometric center. On this basis, the distances from the positions of the openings to be subsequently formed are determined vectorially. In addition to laser machining, it is also possible to use jet cutting techniques, such as water-jet cutting techniques, or chip-removing machining techniques to form the openings.

In a particularly advantageous embodiment of the method, the reference point is determined on the basis of empirically or computationally determined machining characteristics based on known substrate parameters, in particular the material and dimensions. In this manner, it is possible, for example, to take into account both directionally dependent material properties of the substrate and material accumulations in some parts. Thus, in particular, it is also possible in principle to machine three-dimensionally shaped substrates.

Points which can be defined as a reference point include, for example, the center of area, or the center of the state of stress. In practice, however, a particularly practical embodiment of the method is achieved when the centroid of the openings to be formed is defined as the reference point.

In practical applications, the openings can have almost any dimensions and geometries. However, a particular advantageous embodiment of the method is one in which the openings are formed such that they are identical in area. In this manner, different influences on the state of stress which are due to different dimensions or geometries can be prevented. If such different dimensions or geometries are necessary, they are composed from individual identical openings.

A particularly advantageous embodiment of the method is also achieved if the machining program starts with the formation of the opening that has the smallest distance from the reference point, thus machining the central region of the substrate first. It is known from experience that the openings formed there cause the smallest change in the state of stress.

The machining can be carried out radially, starting at the reference point. However, it is particularly advantageous for the machining to be carried out in a path of movement extending around the reference point, in particular in the form of a spiral, in order to thereby reduce the machining time due to the optimized path of movement of the machining head.

Furthermore, it turns out to be particularly practical if measured values obtained during the machining are additionally provided to the machining program as correction values. To this end, it is possible, for example, to determine the states of stress via suitable parameters, which can be associated with the fixture means for this purpose, in order to counteract an unwanted change by correcting the machining program.

In this connection, it is particularly advantageous if an directionally dependent weakening of the substrate material caused by local accumulation of openings is provided to the machining program as a correction value in order that, in a departure from the machining sequence based on the respective distances of the opening positions from the reference point, an unwanted weakening of the substrate caused by unbalanced formation of openings is prevented, for example, by dividing the substrate into quadrants, or parts thereof for this purpose, and by in each instance carrying out an evaluation of the total area of the formed openings for this purpose.

BRIEF DESCRIPTION OF THE DRAWING

The present invention may be embodied in different forms. To further illustrate its basic principle, one embodiment thereof is shown in the drawing and will be described hereinbelow.

DETAILED DESCRIPTION

Figure 1:
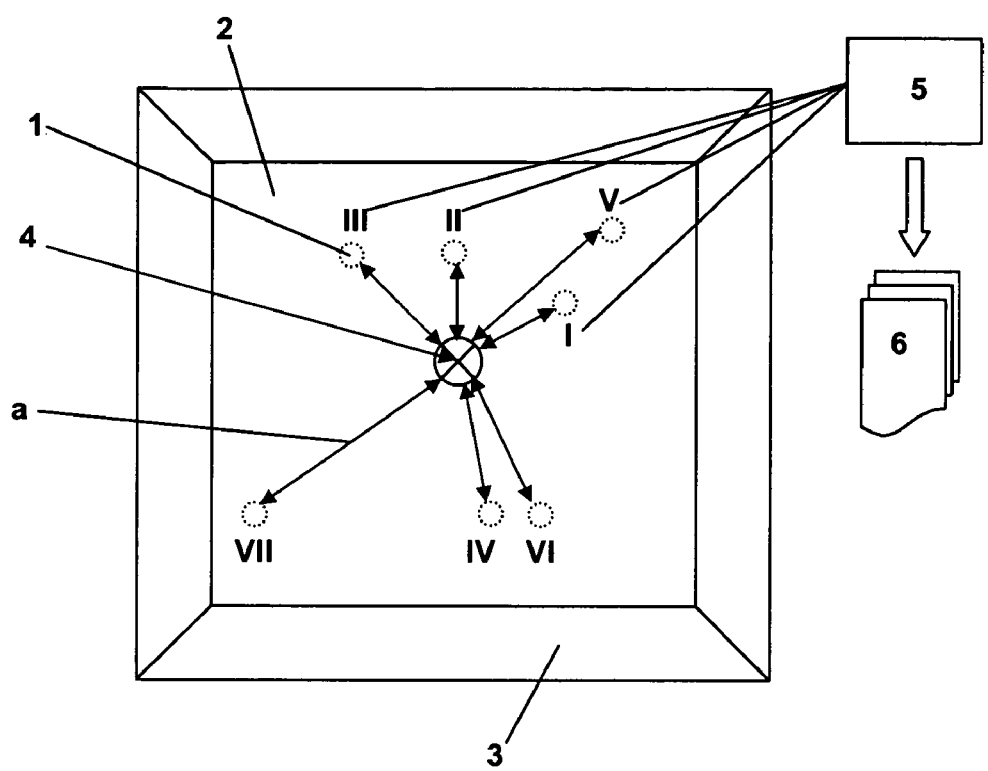
FIG. 1 shows a schematic representation of a setup for forming individual openings of predetermined position in a substrate.

The drawing is a is a schematic representation of a setup for forming individual openings 1 of predetermined position in a substrate 2 in the form of a printing stencil by means of a laser. To this end, substrate 2 is positioned using a fixture means 3 in the form of a tensioning frame. A shift in position of openings 1 resulting from a change in the state of stress of substrate 2 during subsequent processing steps is prevented by first determining the coordinates of a central reference point 4. Then, the respective distances a of the predetermined positions of openings 1 from this reference point 4 are determined, and an order of priority 5 is determined therefrom. This order of priority 5 then forms the basis for a machining program 6, which controls the path of movement of the laser head and forms openings 1 in substrate 2.

What is claimed is:

1. A method for forming openings having predetermined positions in a substrate, the method comprising:
    positioning the substrate being using a fixture device;
    determining coordinates of a reference point in a central region spaced apart from the fixture device;
    calculating a distance of each of the respective predetermined positions of the openings from the reference point;
    determining an order of priority of the distances;
    providing the order of priority to a machining program as the basis for a sequence for forming the openings; and
    providing a correction value to the machining program, wherein the correction value is based on a directionally dependent weakening of the substrate material caused by local accumulation of openings.

2. The method as recited in claim 1, wherein the openings are formed in the substrate so as to create a stencil.

3. The method as recited in claim 1, further comprising forming the openings using a laser.

4. The method as recited in claim 1, wherein the fixture device includes a tensioning frame.

5. The method as recited in claim 1, wherein the determining of the reference point is performed on the basis of empirically or computationally determined machining characteristics based on known substrate parameters.

6. The method as recited in claim 5, wherein the parameters include the material and dimensions of the substrate.

7. The method as recited in claim 1, wherein a centroid of the openings is defined as the reference point.

8. The method as recited in claim 1, further comprising forming the openings so as to be identical in area.

9. The method as recited in claim 1, wherein the order of priority includes starting with formation of an opening having a smallest distance from the reference point.

10. The method as recited in claim 1, wherein the order of priority includes defining a path of movement for forming the openings extending around the reference point.

11. The method as recited in claim 10, wherein in the path of movement is in the form of a spiral.

12. The method as recited in claim 1, further comprising providing the calculated distances to the machining program as correction values.

\* \* \* \* \*